(12) United States Patent
Son et al.

(10) Patent No.: US 8,653,528 B2
(45) Date of Patent: Feb. 18, 2014

(54) THIN FILM TRANSISTOR, DISPLAY DEVICE THEREOF, AND MANUFACTURING METHOD THEREOF

(75) Inventors: Yong-Duck Son, Yongin (KR); Ki-Young Lee, Yongin (KR); Jin-Wook Seo, Yongin (KR); Min-Jae Jeong, Yongin (KR); Byung-Soo So, Yongin (KR); Seung-Kyu Park, Yongin (KR); Kii-Won Lee, Yongin (KR); Yun-Mo Chung, Yongin (KR); Byoung-Keon Park, Yongin (KR); Dong-Hyun Lee, Yongin (KR); Jong-Ryuk Park, Yongin (KR); Tak-Young Lee, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 324 days.

(21) Appl. No.: 13/036,241

(22) Filed: Feb. 28, 2011

(65) Prior Publication Data

US 2011/0227079 A1 Sep. 22, 2011

(30) Foreign Application Priority Data

Mar. 17, 2010 (KR) ........................ 10-2010-0023901

(51) Int. Cl.
*H01L 29/76* (2006.01)
(52) U.S. Cl.
USPC .......... 257/66; 257/59; 257/72; 257/E27.116; 349/47; 349/138

(58) Field of Classification Search
USPC ................ 257/59, 66, 72, E29.151, E27.116; 349/46, 47, 138
See application file for complete search history.

(56) References Cited

U.S. PATENT DOCUMENTS

| 5,264,383 | A  | * | 11/1993 | Young | 438/151 |
| 7,812,894 | B2 | * | 10/2010 | Yamazaki et al. | 349/43 |
| 8,227,302 | B2 | * | 7/2012  | Ohnuma | 438/151 |

FOREIGN PATENT DOCUMENTS

| JP | 04-042579 | 2/1992 |
| JP | 07-263704 | 10/1995 |
| JP | 09-306990 | 11/1997 |
| JP | 11-126904 | 5/1999 |
| JP | 2001-188252 | 7/2001 |
| JP | 2003-203924 | 7/2003 |
| JP | 2009-271527 | 11/2009 |
| KR | 10-2000-0039652 | 7/2000 |
| KR | 10-2002-0043116 | 6/2002 |
| KR | 10-2006-0104146 | 10/2006 |
| KR | 10-2008-0113967 | 12/2008 |

* cited by examiner

*Primary Examiner* — Matthew E Warren
(74) *Attorney, Agent, or Firm* — H.C. Park & Associates, PLC

(57) ABSTRACT

A thin film transistor including: an active layer formed on a substrate; a gate insulating layer pattern formed on a predetermined region of the active layer; a gate electrode formed on a predetermined region of the gate insulating layer pattern; an etching preventing layer pattern covering the gate insulating layer pattern and the gate electrode; and a source member and a drain member formed on the active layer and the etching preventing layer pattern.

21 Claims, 17 Drawing Sheets

THIN FILM TRANSISTOR, DISPLAY DEVICE THEREOF, AND MANUFACTURING METHOD THEREOF

CROSS-REFERENCE TO RELATED APPLICATION

This application claims the benefit of Korean Patent Application No. 10-2010-0023901, filed Mar. 17, 2010, in the Korean Intellectual Property Office, the disclosure of which is incorporated herein by reference.

BACKGROUND

1. Field

The described technology relates generally to a thin film transistor, a display device installing the same, and a manufacturing method thereof. More particularly, the described technology relates generally to a thin film transistor to be effectively used in a large display device.

2. Description of the Related Art

Most flat display devices, such as the organic light emitting diode display and the liquid crystal display, include thin film transistors. Particularly, a low temperature polysilicon thin film transistor (LTPS TFT) has excellent carrier mobility and thus, it is widely used. In general, ohmic contact layers formed in a source region and a drain region of the polysilicon TFT are formed through an ion shower or an ion implanter. The ohmic contact layers reduce contact resistance between an active layer and an electrode. However, as the display device becomes larger, it is difficult to form the ohmic contact layer by using an ion shower or ion implanter. The above information disclosed in this Background section is only for enhancement of understanding of the background of the described technology and therefore it may contain information that does not form the prior art that is already known in this country to a person of ordinary skill in the art.

SUMMARY

Aspects of the present invention relate to a thin film transistor usable in a relatively large display device. Aspects of the present invention provide a method for manufacturing the thin film transistor and the display device.

Aspects of the present invention provide a thin film transistor including: an active layer formed on a substrate; a gate insulating layer pattern formed on a predetermined region of the active layer; a gate electrode formed on a predetermined region of the gate insulating layer pattern; an etching preventing layer pattern covering the gate insulating layer pattern and the gate electrode; and a source member and a drain member formed on the active layer and the etching preventing layer pattern.

According to another aspect of the present invention, the gate insulating layer pattern and the etching preventing layer pattern are patterned with a same pattern.

According to another aspect of the present invention, the source member and the drain member are formed on the gate electrode and are separated with a predetermined space between the source member and the drain member.

According to another aspect of the present invention, the active layer is formed with the same pattern as the source member and the drain member and the source member is separated from the drain member.

According to another aspect of the present invention, the etching preventing layer pattern has an etching selecting ratio different from an etching selecting ratio of the source member and the drain member.

According to another aspect of the present invention, the source member includes: a source electrode; and a source ohmic contact layer disposed between the source electrode and the active layer, and the drain member includes: a drain electrode; and a drain ohmic contact layer disposed between the drain electrode and the active layer.

According to another aspect of the present invention, the source ohmic contact layer and the drain ohmic contact layer are formed of an n-type or p-type impurity doped hydrogenated amorphous silicon (a-Si:H) layer.

Aspects of the present invention provide a method of manufacturing a thin film transistor, including: forming an active layer on a substrate; forming a gate insulating layer on a predetermined region of the active layer; forming a gate electrode on a predetermined region of the gate insulating layer; forming an etching preventing layer covering the gate insulating layer and the gate electrode; forming a gate insulating layer pattern and an etching preventing layer pattern with the same pattern by patterning the gate insulating layer and the etching preventing layer; and forming a source member and a drain member on the active layer and the etching preventing layer pattern.

According to another aspect of the present invention, the source member and the drain member are formed on the gate electrode and are separated from each other with a predetermined space between the source member and the drain member.

According to another aspect of the present invention, the active layer is formed with a same pattern as the source member and the drain member and the source member is separated from the drain member.

According to another aspect of the present invention, the etching preventing layer pattern has an etching selecting ratio different from an etching selecting ratio of the source member and the drain member.

According to another aspect of the present invention, the source member includes: a source electrode; and a source ohmic contact layer disposed between the source electrode and the active layer, and the drain member includes: a drain electrode; and a drain ohmic contact layer disposed between the drain electrode and the active layer.

According to another aspect of the present invention, the source ohmic contact layer and the drain ohmic contact layer are formed of an n-type or p-type impurity doped hydrogenated amorphous silicon (a-Si:H) layer.

According to another aspect of the present invention, the source ohmic contact layer and the drain ohmic contact layer are formed by a chemical vapor deposition (CVD) method.

Aspects of the present invention provide a display device including: a display having a display area; and thin film transistors (TFTs) disposed in the display area, each of the TFTs including: an active layer formed on a substrate; a gate insulating layer pattern formed on a predetermined region of the active layer; a gate electrode formed on a predetermined region of the gate insulating layer pattern; an etching preventing layer pattern covering the gate insulating layer pattern and the gate electrode; and a source member and a drain member formed on the active layer and the etching preventing layer pattern.

According to another aspect of the present invention, the gate insulating layer pattern and the etching preventing layer pattern are patterned with a same pattern.

According to another aspect of the present invention, the source member and the drain member are formed on the gate electrode and are separated with a predetermined space between the source member and the drain member.

According to another aspect of the present invention, the active layer is formed with a same pattern as the source member and the drain member and the source member is separated from the drain member.

According to another aspect of the present invention, the etching preventing layer pattern has an etching selecting ratio different from an etching selecting ratio of the source member and the drain member.

According to another aspect of the present invention, the source member includes: a source electrode; and a source ohmic contact layer disposed between the source electrode and the active layer, and the drain member includes: a drain electrode; and a drain ohmic contact layer disposed between the drain electrode and the active layer.

According to another aspect of the present invention, the source ohmic contact layer and the drain ohmic contact layer are formed of an n-type or p-type impurity doped hydrogenated amorphous silicon (a-Si:H) layer.

According to another aspect of the present invention, the display device further includes a capacitor including: a first capacitor electrode formed on a same layer as the active layer; a gate insulating layer pattern formed on the first capacitor electrode; and a second capacitor electrode formed with the same material as the gate electrode on the gate insulating layer pattern.

According to another aspect of the present invention, the capacitor further includes: a dummy ohmic contact layer formed on the second capacitor electrode; and a dummy electrode formed on the dummy ohmic contact layer, wherein the etching preventing layer pattern is formed between the dummy ohmic contact layer and the second capacitor electrode.

According to another aspect of the present invention, the first capacitor electrode, the gate insulating layer pattern, the etching preventing layer pattern, the dummy ohmic contact layer, and the dummy electrode are formed with a same pattern.

According to another aspect of the present invention, the display device further includes an organic light emitting element formed on the substrate.

According to another aspect of the present invention, the display device further includes a liquid crystal layer formed on the substrate.

Aspects of the present invention provide a method of manufacturing a display device, including: providing a substrate having a display area; forming a thin film transistor (TFT) in the display area of the substrate, the forming of the TFT including: forming an active layer on the substrate; forming a gate insulating layer on a predetermined region of the active layer; forming a gate electrode on a predetermined region of the gate insulating layer; forming an etching preventing layer covering the gate insulating layer and the gate electrode; forming a gate insulating layer pattern and an etching preventing layer pattern with a same pattern by patterning the gate insulating layer and the etching preventing layer; and forming a source member and a drain member on the active layer and the etching preventing layer pattern.

According to another aspect of the present invention, the source member and the drain member are formed on the gate electrode and are separated from each other with a predetermined space between the source member and the gate member.

According to another aspect of the present invention, the active layer is formed with a same pattern as the source member and the drain member and the source member is separated from the drain member.

According to another aspect of the present invention, the etching preventing layer pattern has an etching selecting ratio different from an etching selection ratio of the source member and the drain member.

According to another aspect of the present invention, the source member includes: a source electrode; and a source ohmic contact layer disposed between the source electrode and the active layer, and the drain member includes: a drain electrode; and a drain ohmic contact layer disposed between the drain electrode and the active layer.

According to another aspect of the present invention, the source ohmic contact layer and the drain ohmic contact layer are formed of an n-type or p-type impurity doped hydrogenated amorphous silicon (a-Si:H) layer.

According to another aspect of the present invention, the source ohmic contact layer and the drain ohmic contact layer are formed by a chemical vapor deposition (CVD) method.

According to another aspect of the present invention, the method further includes forming a capacitor by: forming a first capacitor electrode on a same layer as the active layer; forming a gate insulating layer pattern on the first capacitor electrode; and forming a second capacitor electrode with the same material as the gate electrode on the gate insulating layer pattern.

According to another aspect of the present invention, the forming of the capacitor further includes: forming a dummy ohmic contact layer on the second capacitor electrode with the etching preventing layer pattern disposed between the dummy ohmic contact layer and the second capacitor; and forming a dummy electrode on the dummy ohmic contact layer.

According to another aspect of the present invention, the first capacitor electrode, the gate insulating layer pattern, the etching preventing layer pattern, the dummy ohmic contact layer, and the dummy electrode are formed with the same pattern.

According to another aspect of the present invention, the method further includes an organic light emitting element formed on the substrate.

According to another aspect of the present invention, the method further includes forming a liquid crystal layer on the substrate.

According to aspects of the present invention, the thin film transistor can be efficiently used for a relatively large display device. Also, a relatively large display device can be efficiently manufactured by using the thin film transistor.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
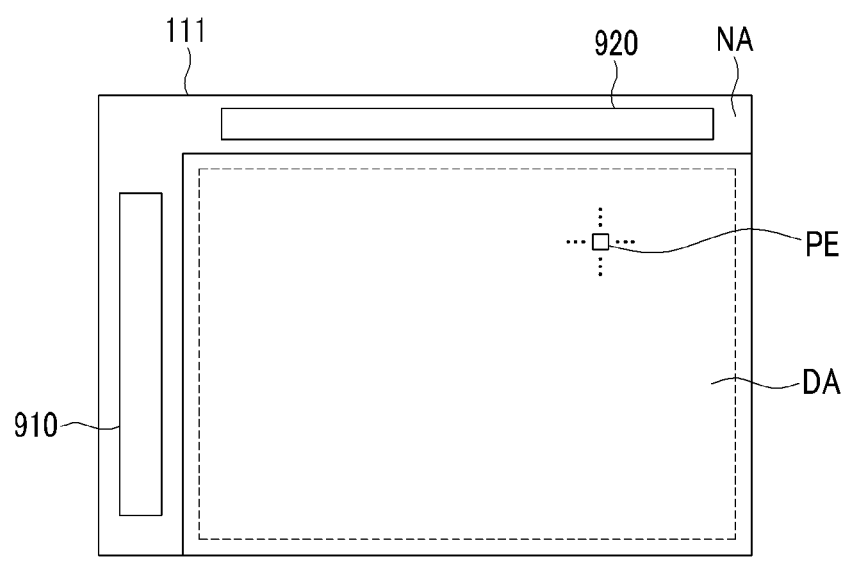
FIG. 1 shows a top plan view of a configuration of a display device according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that one element, film or layer is "formed on" or "disposed on" a second element, layer or film, the first element, layer or film may be formed or disposed directly on the second element, layer or film or there may be intervening element, layers or films between the first element, layer or film and the second element, layer or film. Further, as used herein, the term "formed on" is used with the same meaning as "located on" or "disposed on" and is not meant to be limiting regarding any particular fabrication process. In the drawings, the sizes and thicknesses of the components are merely shown for convenience of explanation, and therefore the present invention is not necessarily limited to the illustrations described and shown herein. In the drawings, the thickness of layers, films, panels, regions, etc., are exaggerated for clarity.

A display device 101 including a thin film transistor (TFT) 10 according to an exemplary embodiment will now be described with reference to FIG. 1 to FIG. 3.

As shown in FIG. 1, the display device 101 includes a main substrate body 111 that is included in a display divided into a display area DA and a non-display area NA. Pixel areas PE are formed in the display area DA to display images, and at least one of driving circuits 910 and 920 is formed in the non-display area NA. The pixel area PE is a region having a pixel, the pixel being the minimum unit of displaying the image. However, aspects of the present invention are not limited thereto and the driving circuits 910 and 920 do not need to be formed in the non-display area NA, and a part of or both the driving circuits 910 and 920 may be omitted.

Figure 2:
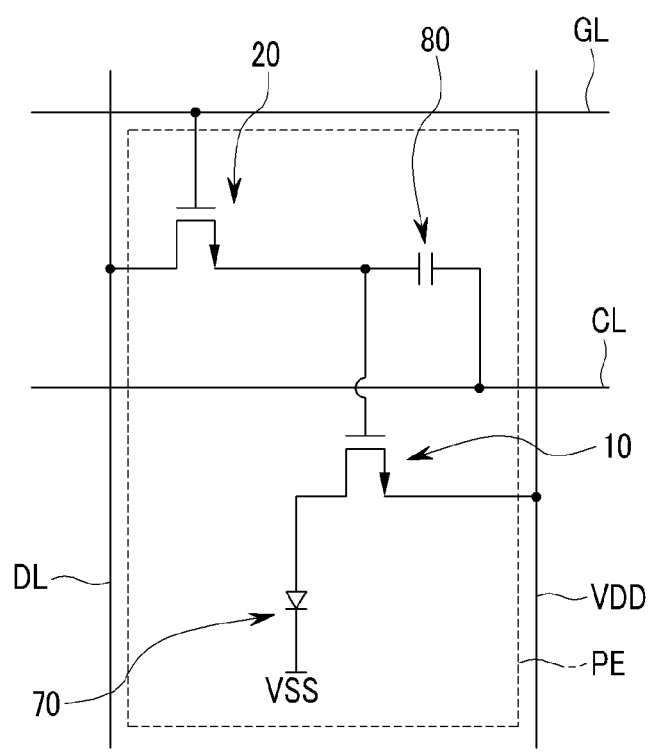
FIG. 2 shows a circuit diagram of a pixel circuit of a display device shown in FIG. 1.

As shown in FIG. 2, the display device 101 is an organic light emitting diode (OLED) display having a 2Tr-1Cap structure in which a pixel area (PE) includes an OLED 70, two thin film transistors (TFTs) 10 and 20, and a capacitor 80. However, aspects of the present invention are not limited thereto. Therefore, the display device 101 can be an OLED display having a structure in which at least three TFTs and at least two capacitors are disposed for each pixel area PE. Also, the display device 101 can be configured to have various configurations with an additional wire. Hence, at least one of the additionally formed TFT and the capacitor can be an element of a compensation circuit.

The compensation circuit improves the uniformity of the organic light emitting diode 70 formed at each pixel area PE, and prevents the image quality from being deviated. The compensation circuit generally includes two to eight TFTs. Also, the driving circuits 910 and 920, as shown in FIG. 1, formed in the non-display area NA of the main substrate body 111 can include additional TFTs.

The OLED 70 includes an anode that is a hole injection electrode, a cathode that is an electron injection electrode, and an organic emissive layer disposed between the anode and the cathode. In detail, the display device 101 includes a first thin film transistor 10 and a second thin film transistor 20 in each pixel area PE. The first thin film transistor 10 and the second thin film transistor 20 respectively include a gate electrode, an active layer, a source electrode, and a drain electrode. FIG. 2 shows a gate line GL, a data line DL, a common power line VDD, and a capacitor line CL, however, aspects of the present invention are not restricted to the configuration shown in FIG. 2. Therefore, the capacitor line (CL) can be omitted depending on the cases.

A source electrode of the second TFT 20 is connected to the data line DL, and a gate electrode of the second TFT 20 is connected to the gate line GL. A drain electrode of the second TFT 20 is connected to the capacitor line CL through the capacitor 80. A node is formed between the drain electrode of the second TFT 20 and the capacitor 80, and the gate electrode of the first TFT 10 is connected thereto. The common power line VDD is connected to the drain electrode of the first TFT 10, and an anode of the organic light emitting element 70 is connected to the source electrode.

The second TFT 20 is used as a switch selecting a pixel area PE to emit light. When the second TFT 20 is turned on, the capacitor 80 is instantly charged, and the charged amount is proportional to the potential of the voltage applied by the data line DL. When the second TFT 20 turns off and signals are input into the capacitor line CL while increasing the voltage by a cycle of one frame, the gate potential of the first TFT 10 is increased along with the voltage applied through the capacitor line CL, according to the potential of the capacitor 80. When the gate potential of the first TFT 10 goes over a threshold voltage, the second TFT 20 is turned on. Then, the voltage applied to the common power line VDD is applied to the organic light emitting diode 70 through the first TFT 10 so that the organic light emitting diode 70 emits light. However, aspects of the present invention are not limited thereto, and the structure of the pixel area PE may be variously modified as would be easily appreciated and made by a person skilled in the art.

Configuration of the TFTs 10 and 20 and the capacitor 80 according to the first exemplary embodiment will now be described in detail with reference to FIG. 3. The first TFT 10 from among the TFTs 10 and 20 will be exemplified.

The substrate 111 is formed with an insulating substrate having glass, quartz, ceramic, plastic or other suitable materials. However, aspects of the present invention are not limited thereto, and the substrate 111 may be formed with a metallic substrate based on stainless steel. Further, the substrate 111 can be flexible if made of plastic.

A buffer layer 120 is formed on the substrate 111. The buffer layer 120 is formed with a single-layered structure of silicon nitride (SiNx), or a double-layered structure based on silicon nitride (SiNx) and silicon oxide ($SiO_2$). However, aspects of the present invention are not limited thereto, and the buffer layer 120 may be formed of other suitable materials. The buffer layer 120 prevents unneeded components like impure elements or moisture from intruding into the target while flattening the surface thereof. The buffer layer 120 can be used or omitted according to the type of the substrate 111 and its processing conditions.

An active layer 131 and a first capacitor electrode 138 are formed on the buffer layer 120. The active layer 131 and the first capacitor electrode 138 are formed by patterning a polysilicon layer 1300 (shown in FIG. 4). That is, the active layer 131 and the first capacitor electrode 138 are formed of the same material. However, aspects of the present invention are not limited thereto and the active layer 131 may also be formed with an amorphous silicon layer. In addition, the active layer 131 and the first capacitor electrode 138 can be formed with different materials.

A gate insulating layer pattern 140 is formed on the active layer 131 and the first capacitor electrode 138. In detail, the gate insulating layer pattern 140 is formed on a part of the active layer 131 and the whole of the first capacitor electrode 138. That is, the gate insulating layer pattern 140 covers the whole first capacitor electrode 138 and part of the active layer 131. The gate insulating layer 140 is formed of at least one material selected from tetraethyl orthosilicate (TEOS), silicon nitride (SiNx), and silicon oxide (SiO$_2$), or other suitable materials well known to a person skilled in the art.

A gate electrode 151 and a second capacitor electrode 158 are formed on the gate insulating layer pattern 140. In this instance, the gate electrode 151 is formed on a predetermined region of the gate insulating layer pattern 140 which is disposed on the active layer 131. The second capacitor electrode 158 is formed on the whole or a part of the gate insulating layer pattern 140 which is disposed on the first capacitor electrode 138.

The gate electrode 151 and the second capacitor electrode 158 are formed of the same material. The gate electrode 151 and the second capacitor electrode 158 are formed of at least one of molybdenum (Mo), chromium (Cr), aluminum (Al), silver (Ag), titanium (Ti), tantalum (Ta), and tungsten (W), or other suitable materials known to a person skilled in the art.

An etching preventing layer pattern 160 is formed on the gate electrode 151 and the second capacitor electrode 158. The etching preventing layer pattern 160 is formed to cover the gate electrode 151 over the gate insulating layer pattern 140. Also, the etching preventing layer pattern 160 is formed to cover the second capacitor electrode 158 and the gate insulating layer pattern 140. The etching preventing layer pattern 160 is formed in the same pattern as the gate insulating layer pattern 140 with the gate electrode 151 and the second capacitor electrode 158 between the etching preventing layer pattern 160 and the gate insulating layer pattern 140. The capacitor 80 is formed by the first capacitor electrode 138, the second capacitor electrode 158, and the gate insulating layer pattern 140 disposed between them.

The etching preventing layer pattern 160 is formed with an insulation material having an etching selecting ratio that is different from those of a source ohmic contact layer 173 and a drain ohmic contact layer 175, which are described later. Here, a difference of the etching selecting ratios signifies that the etching preventing layer pattern 160 is not etched while the source ohmic contact layer 173 and the drain ohmic contact layer 175 are etched. The etching preventing layer pattern 160 protects the gate electrode 151 and the second capacitor electrode 158 in subsequent processes, and prevents the active layer 131 from being etched and damaged.

A source ohmic contact layer 173 and a drain ohmic contact layer 175 are formed on the active layer 131 and the etching preventing layer pattern 160. The source ohmic contact layer 173 and the drain ohmic contact layer 175 are formed over a part of the etching preventing layer pattern 160 and over the active layer 131 that does not overlap the etching preventing layer pattern 160. Also, the source ohmic contact layer 173 and the drain ohmic contact layer 175 are separated by the gate electrode 151 disposed therebetween. That is, the source ohmic contact layer 173 and the drain ohmic contact layer 175 are separated with a predetermined space therebetween on the gate electrode 151.

Figure 10:
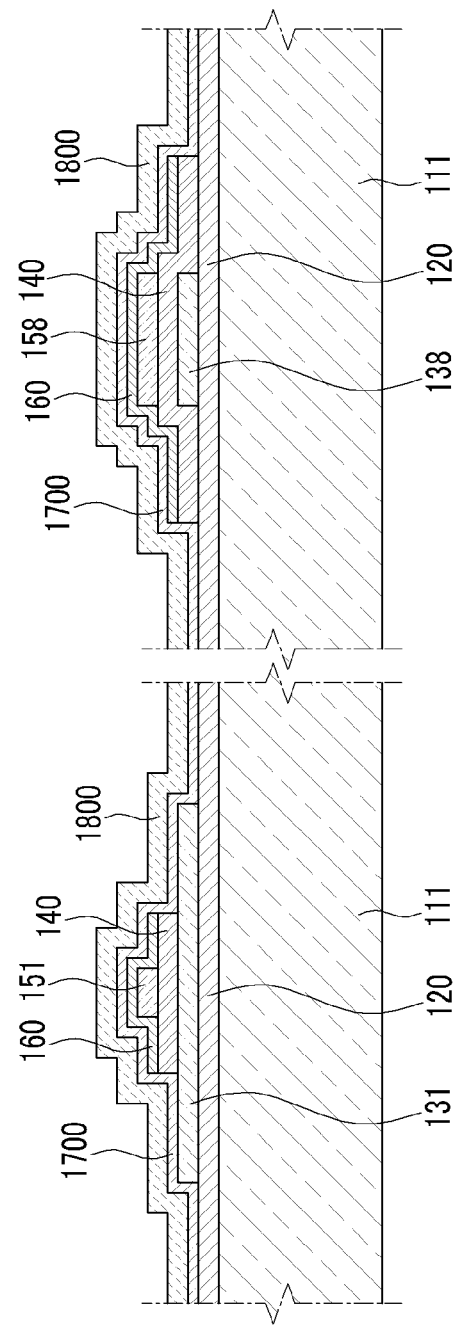

The source ohmic contact layer 173 and the drain ohmic contact layer 175 are formed with the n-type or p-type impurity doped hydrogenated amorphous silicon (a-Si:H) layer 1700 (shown in FIG. 10). Therefore, according to the present exemplary embodiment, an ion shower or ion implanter process can be omitted in the process of manufacturing the display device 101. The source ohmic contact layer 173 and the drain ohmic contact layer 175 are formed by the chemical vapor deposition (CVD) method. However, aspects of the present invention are not limited thereto and the source ohmic contact layer 173 and the drain ohmic contact layer 175 may be formed by other suitable methods.

A source electrode 183 and a drain electrode 185 are formed on the source ohmic contact layer 173 and the drain ohmic contact layer 175, respectively. The source electrode 183 and the drain electrode 185 are formed with the same pattern together with the source ohmic contact layer 173 and the drain ohmic contact layer 175. Therefore, the source electrode 183 and the drain electrode 185 are separated in a manner similar to that of the source ohmic contact layer 173 and the drain ohmic contact layer 175.

The source ohmic contact layer 173 and the source electrode 183 are called source members, and the drain ohmic contact layer 175 and the drain electrode 185 are called drain members. As described, the active layer 131 is formed with the same pattern as the source member and drain member except that the source member and the drain member are separated. A TFT 10 is formed by the active layer 131, the gate electrode 151, the source electrode 183, and the drain electrode 185.

Also, the source electrode 183 and the drain electrode 185 are separated with a predetermined space therebetween on the gate electrode 151. That is, the display device 101 includes a TFT 10 having an offset configuration in which the source electrode 183 and the drain electrode 185 are horizontally separated from the gate electrode 151. In other words, the source electrode 183 and the drain electrode 185 do not overlap with each other. When the TFT 10 is formed in the offset configuration, a leakage current is reduced. The etching preventing layer pattern 160 prevents the active layer 131 from being partially etched and damaged when the source electrode 183 and the drain electrode 185 are patterned to be separated from the gate electrode 151. Also, the source electrode 183 and the drain electrode 185 can be formed with various metallic materials and in a like manner of the gate electrode 151, as is well known to one of ordinary skill in the art.

Figure 3:
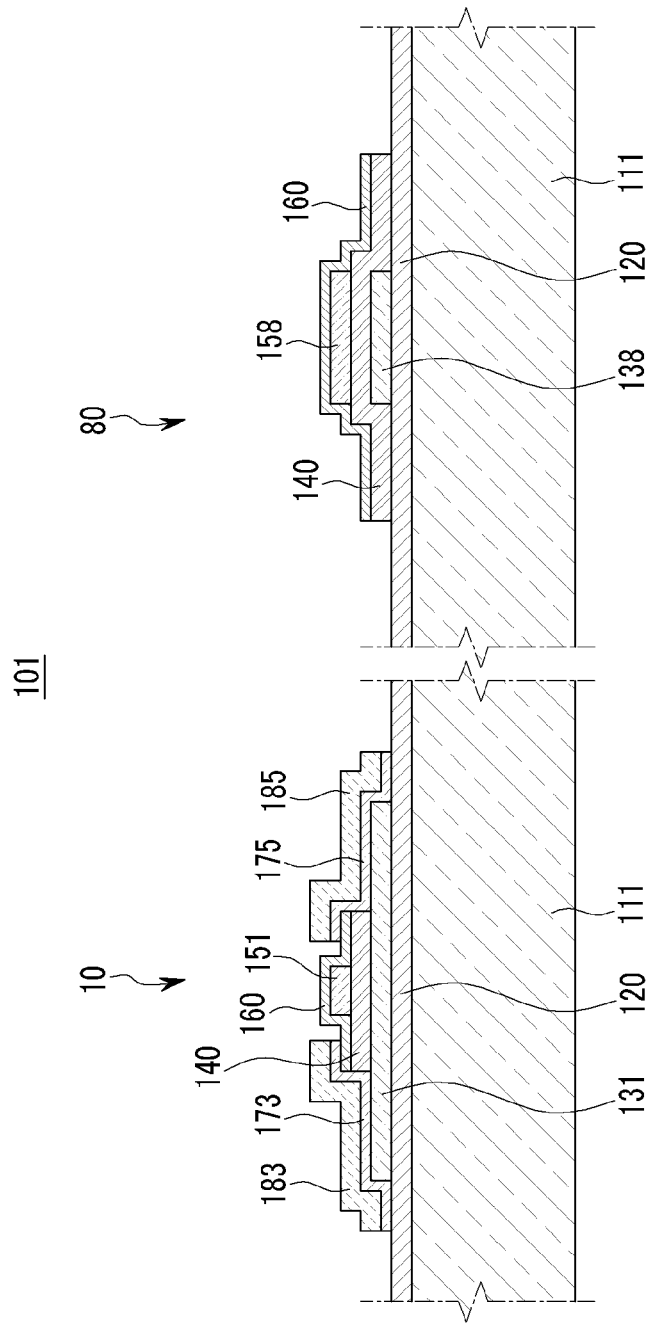
FIG. 3 shows a partial enlarged cross-sectional view of a thin film transistor and a capacitor used for a display device of FIG. 1.

Although not shown in FIG. 3, the capacitor 80 can further include a dummy ohmic contact layer and a dummy electrode formed on the etching preventing layer pattern 160. The dummy ohmic contact layer can be formed on the same layer and with the same material as the source ohmic contact layer 173 and the drain ohmic contact layer 175. The dummy electrode can be formed on the same layer and with the same material as the source electrode 183 and the drain electrode 185. Accordingly, the capacitor 80 configuration may be a dual structure including the dummy electrode.

According to the above-described configuration, the display device 101, according to the present exemplary embodiment can be effectively enlarged. That is, the display device 101 can be manufactured without using the ion shower or ion implanter process that is disadvantageous for the large area process while having the polysilicon TFT. Also, the display device 101 can be stably manufactured by preventing overetching.

Figure 4:
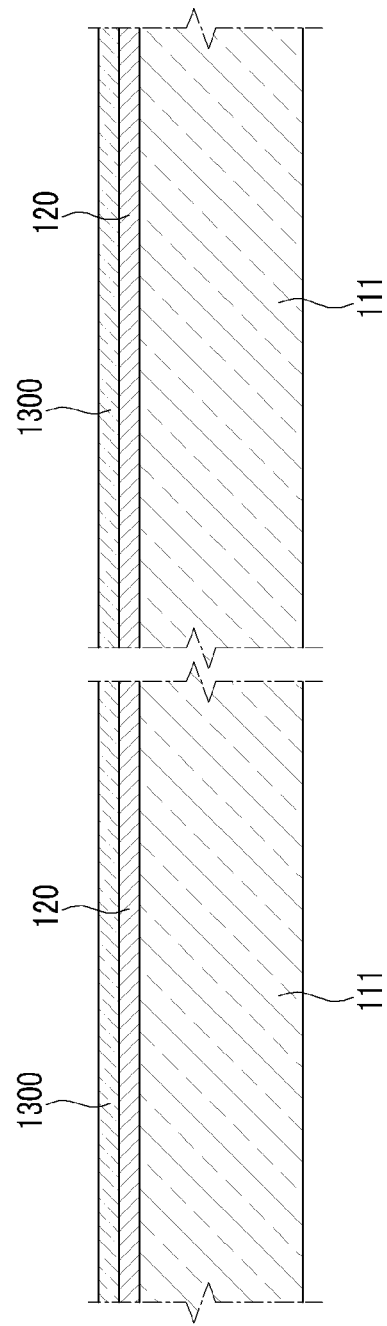
FIGS. 4 to 10 show cross-sectional views sequentially showing a process of manufacturing a thin film transistor and a capacitor shown in FIG. 3.

A method for manufacturing a display device 101 with reference to a TFT 10, according to the exemplary embodiment of FIG. 3, will now be described with reference to FIG. 4 to FIG. 10. As shown in FIG. 4, a buffer layer 120 and a polysilicon layer 1300 are formed on a substrate 111. The buffer layer 120 is formed with a single-layered structure having silicon nitride (SiNx), or a double-layered structure having silicon nitride (SiNx) and silicon oxide (SiO2). The polysilicon layer 1300 is formed by depositing an amorphous silicon layer (not shown) on the buffer layer 120 and crystallizing the amorphous silicon layer. The amorphous silicon layer is crystallized by applying heat or a laser, or by using a metal catalyst that is well known to a skilled person.

Figure 5:
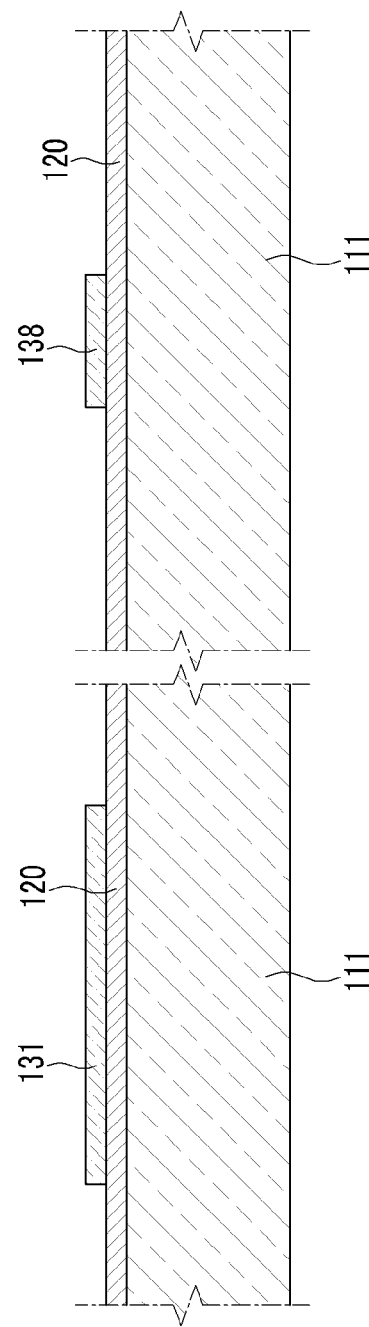
Figure 6:
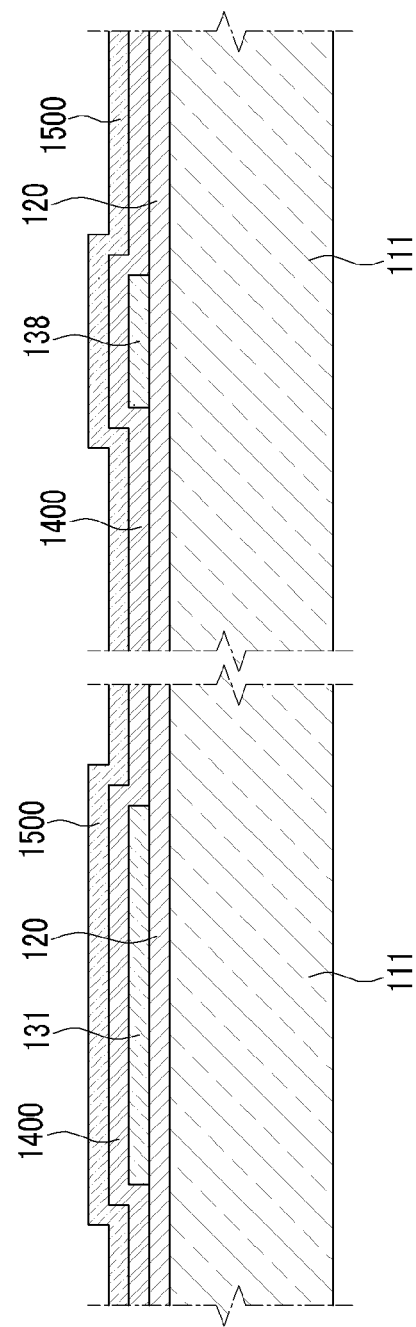
Figure 7:
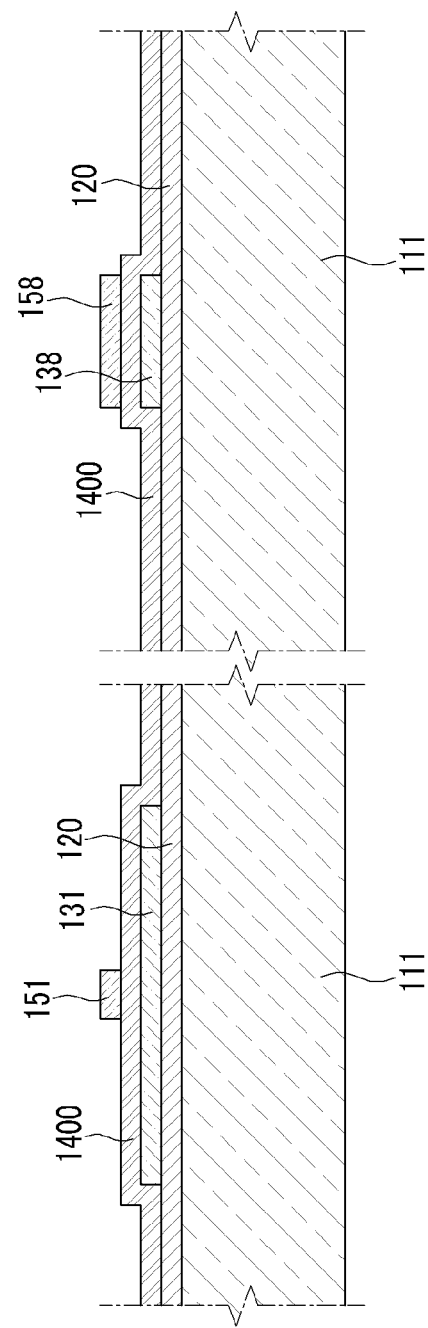

As shown in FIG. 5, an active layer 131 and a first capacitor electrode 138 are formed by patterning the polysilicon layer 1300. The active layer 131 and the first capacitor electrode 138 are patterned by a photolithography process. As shown in FIG. 6, a gate insulating layer 1400 and a gate metal layer 1500 are formed on the active layer 131 and the first capacitor electrode 138. As shown in FIG. 7, a gate electrode 151 and a second capacitor electrode 158 are formed by patterning the gate metal layer 1500. The gate electrode 151 and the second capacitor electrode 158 are patterned by a photolithography process.

Figure 8:
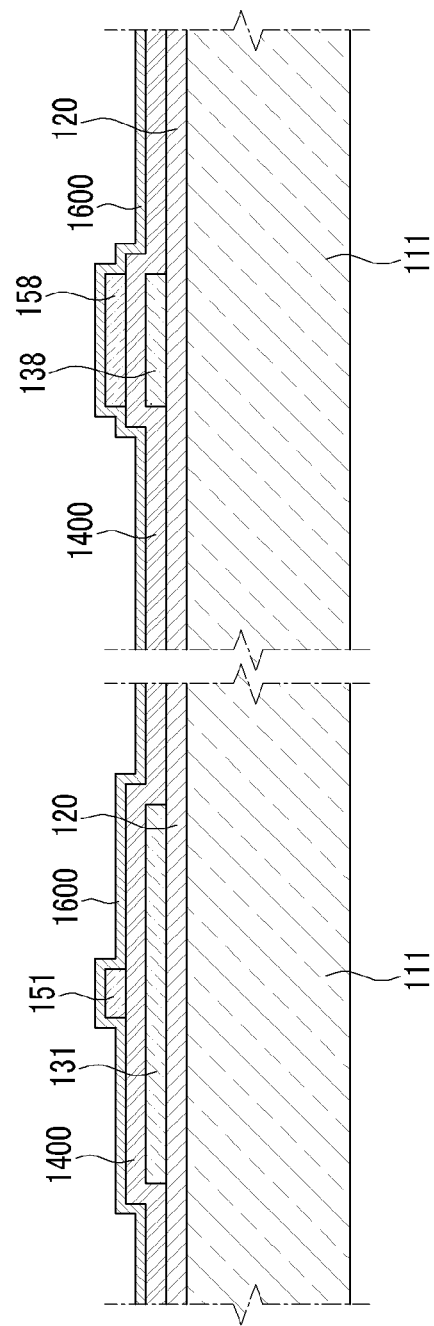

As shown in FIG. 8, an etching preventing layer 1600 is formed on the gate insulating layer 1400 and over the gate electrode 151 and the second capacitor electrode 158. The etching preventing layer 1600 is made of a material having an etching selecting ratio that is different from those of the source ohmic contact layer 173 and the drain ohmic contact layer 175, which will be described later.

Figure 9:
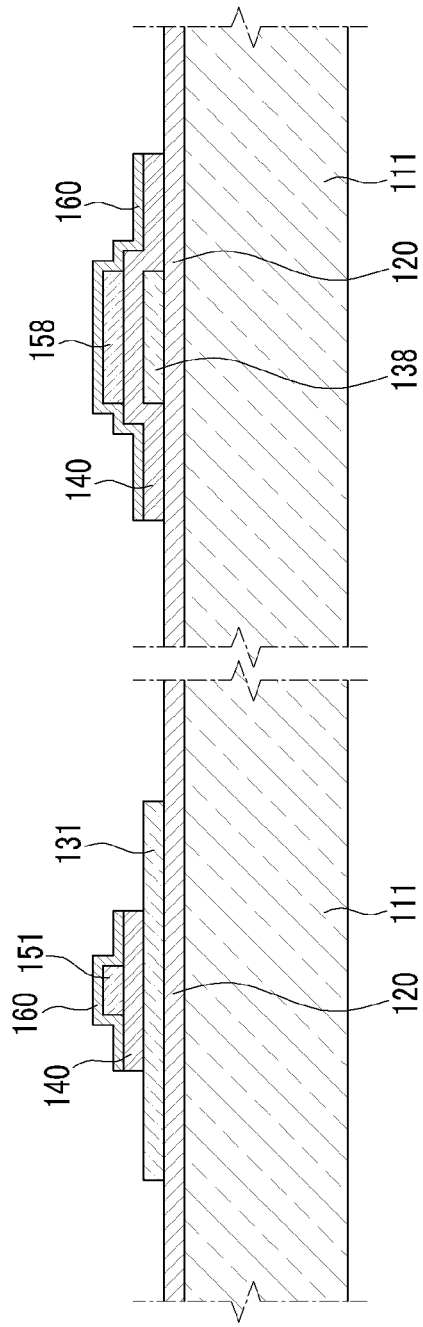

As shown in FIG. 9, an etching preventing layer pattern 160 and a gate insulating layer pattern 140 are formed by patterning the etching preventing layer 1600 and the gate insulating layer 1400, respectively. The gate insulating layer pattern 140 is formed on a predetermined region of the active layer 131, and it is formed to cover a whole of the first capacitor electrode 138. The etching preventing layer pattern 160 is formed with the same pattern as the gate insulating layer pattern 140. The gate electrode 151 and the second capacitor electrode 158 are disposed between the etching preventing layer pattern 160 and the gate insulating layer pattern 140. In this instance, the etching preventing layer pattern 160 and the gate insulating layer pattern 140 are patterned through the photolithography process.

As shown in FIG. 10, an n-type or p-type impurity doped a-Si:H layer 1700 and a data metal layer 1800 are sequentially formed on the etching preventing layer pattern 160.

The n-type or p-type impurity doped a-Si:H layer 1700 is patterned to form a source ohmic contact layer 173 and a drain ohmic contact layer 175 as shown in FIG. 3. The data metal layer 1800 is patterned to form a source electrode 183, and a drain electrode 185 as shown in FIG. 3. The source ohmic contact layer 173, the drain ohmic contact layer 175, the source electrode 183, and the drain electrode 185 are patterned by a photolithography process. The photolithography process includes a dual exposure or half tone exposure process.

The source ohmic contact layer 173 and the drain ohmic contact layer 175 are formed over the etching preventing layer pattern 160 and on the active layer 131 that is not overlapped on the etching preventing layer pattern 160. Also, the source ohmic contact layer 173 and the drain ohmic contact layer 175 are separated with the gate electrode 151 being disposed therebetween. The source electrode 183 and the drain electrode 185 are formed with the same pattern together with the source ohmic contact layer 173 and the drain ohmic contact layer 175. Therefore, the source electrode 183 and the drain electrode 185 are separated from each other in a manner similar to that of the source ohmic contact layer 173 and the drain ohmic contact layer 175. However, aspects of the present invention are not limited thereto, and when the source member is not separated from the drain member, the active layer 131 is formed with the same pattern as the source member and the drain member.

The source ohmic contact layer 173, the drain ohmic contact layer 175, the source electrode 183, and the drain electrode 185 are separated from the gate electrode 151 in the horizontal direction. The etching preventing layer pattern 160 prevents the active layer 131 from being damaged when the source ohmic contact layer 173, the drain ohmic contact layer 175, the source electrode 183, and the drain electrode 185 are patterned to be horizontally separated from the gate electrode 151. Thus, the etching preventing layer pattern 160 is provided below the source ohmic contact layer 173, the drain ohmic contact layer 175, the source electrode 183, and the drain electrode 185 on the active layer 131. Therefore, the etching preventing layer pattern 160 protects the active layer 131 by preventing overetching in the etching process.

The etching preventing layer pattern 160 protects the gate electrode 151 and the second capacitor electrode 158 when the source ohmic contact layer 173, the drain ohmic contact layer 175, the source electrode 183, and the drain electrode 185 are formed. Since the source ohmic contact layer 173 and the drain ohmic contact layer 175 are formed by patterning the n-type or p-type impurity doped a-Si:H layer, the ion shower or ion implanter process, which is relatively difficult to use in the large area process, can be omitted in the process of manufacturing the display device 101.

Through the above-described manufacturing method, the display device 101, according to the previous exemplary embodiment, can be manufactured. That is, the large display device 101 can be efficiently manufactured. In detail, the display device 101 can be manufactured without using the ion shower or ion implanter process that is disadvantageous to the large area process while using the polysilicon TFT. Also, the display device 101 can be stably manufactured by preventing overetching.

Figure 11:
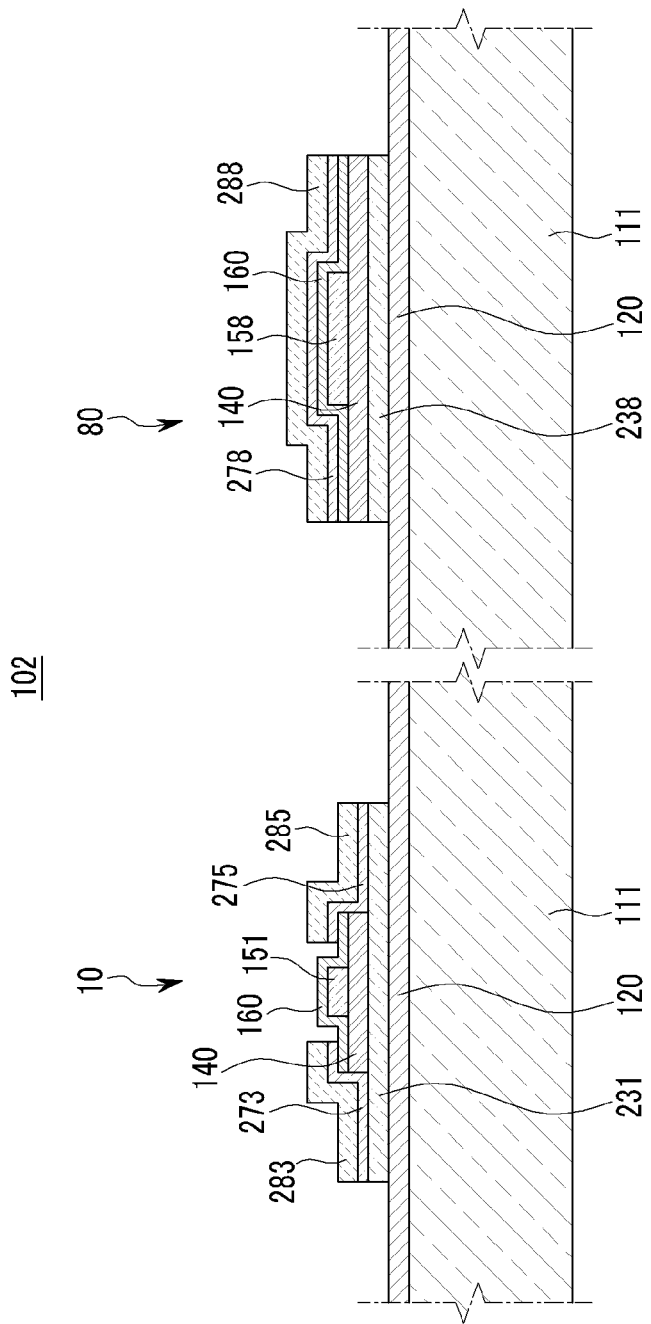
FIG. 11 shows a partial enlarged cross-sectional view of a thin film transistor and a capacitor used in a display device according to another exemplary embodiment.

A display device 102 according to another exemplary embodiment will now be described with reference to FIG. 11. The display device 102 is an organic light emitting diode (OLED) display. As shown in FIG. 11, a source ohmic contact layer 273 and a drain ohmic contact layer 275 of the display device 102 are formed with the same pattern as an active layer 231 except for in a region overlapped on the etching preventing layer pattern 160. A source electrode 283 and a drain electrode 285 are formed with the same pattern as the source ohmic contact layer 273 and the drain ohmic contact layer 275, respectively.

The source ohmic contact layer 273 and the drain ohmic contact layer 275 are formed on the active layer 131 on an area that does not overlap with the etching preventing layer pattern 160 and over a part of the etching preventing layer pattern 160. The source ohmic contact layer 273 and the drain ohmic contact layer 275 are separated with the gate electrode 151 disposed therebetween. The source electrode 283 and the drain electrode 285 are formed with the same pattern and together with the source ohmic contact layer 273 and the drain ohmic contact layer 275. Hence, the source electrode 283 and the drain electrode 285 are separated from each other in a manner similar to that of the source ohmic contact layer 273 and the drain ohmic contact layer 275. Also, the source ohmic contact layer 273, the drain ohmic contact layer 275, the source electrode 283, and the drain electrode 285 are horizontally separated from the gate electrode 151.

The capacitor 80 further includes a dummy ohmic contact layer 278 formed on the etching preventing layer pattern 160 and a dummy electrode 288 formed on the dummy ohmic contact layer 278. The dummy electrode 288 is formed so as to not function, and the capacitor 80 can be used as a dual structure capacitor. The first capacitor electrode 238, the dummy ohmic contact layer 278, and the dummy electrode 288 are formed with the same pattern. The first capacitor electrode 238 is formed of the same material as the active layer 231. The dummy ohmic contact layer 278 is formed of the same material as the source ohmic contact layer 273 and the drain ohmic contact layer 275. The dummy electrode 288 is formed of the same material as the source electrode 283 and the drain electrode 285.

By the above-described configuration, the display device 102, according to the present exemplary embodiment, can be efficiently enlarged and its manufacturing process can be simplified. In detail, the active layer 231, the first capacitor electrode 238, the source ohmic contact layer 273, the drain ohmic contact layer 275, the dummy ohmic contact layer 278, the source electrode 283, the drain electrode 285, and the dummy electrode 288 are formed together through one photolithography process. Therefore, at least one photolithography process can be reduced when compared to the previous exemplary embodiment.

The display device 102 is manufactured without using the ion shower or ion implanter process while having the polysilicon TFT. The display device 102 can be stably manufactured by preventing overetching. A method for manufacturing a display device 102, according to present exemplary embodiment, as shown in FIG. 11, will now be described with reference to FIG. 12 to FIG. 16.

Figure 12:
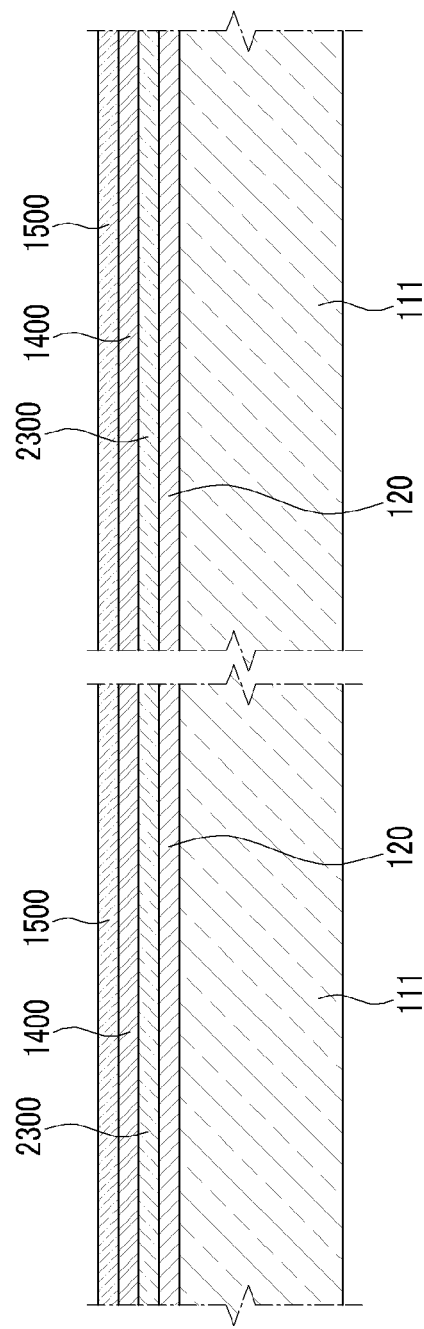
FIGS. 12 to 16 show sequential cross-sectional views of a process of manufacturing a thin film transistor and a capacitor shown in FIG. 11.
Figure 13:
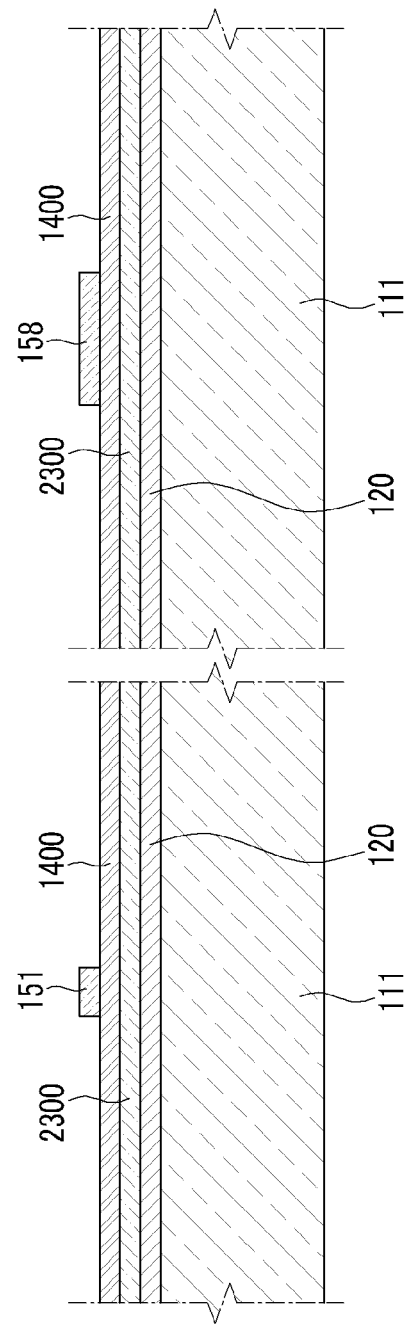
Figure 14:
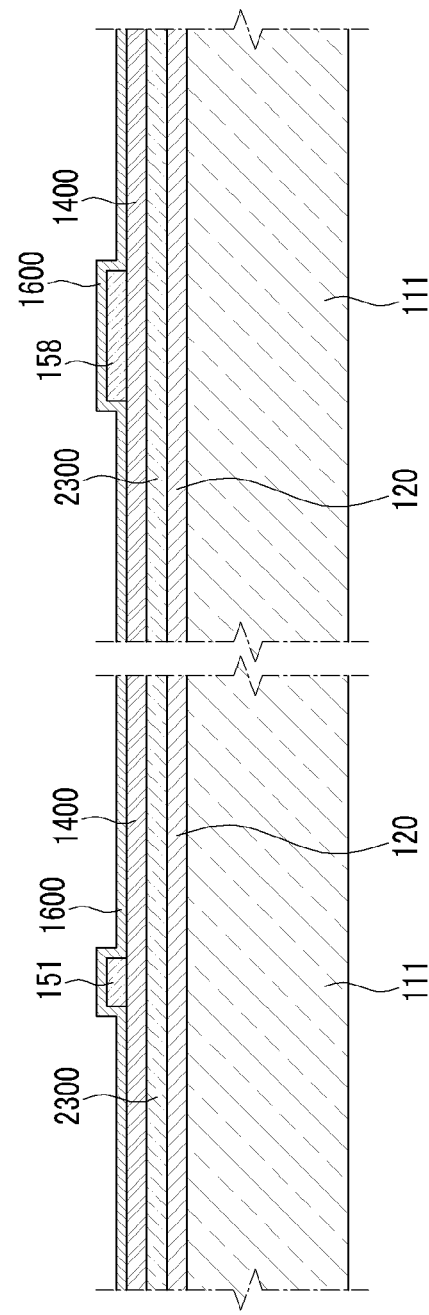

As shown in FIG. 12, a buffer layer 120, a polysilicon layer 2300, a gate insulating layer 1400, and a gate metal layer 1500 are sequentially formed on the substrate 111. As shown in FIG. 13, a gate electrode 151 and a second capacitor electrode 158 are formed by patterning the gate metal layer 1500. The gate electrode 151 and the second capacitor electrode 158 are patterned by the photolithography process. As shown in FIG. 14, an etching preventing layer 1600 is formed on the gate electrode 151 and the second capacitor electrode 158 and over the gate insulating layer 1400. The etching preventing layer 1600 is made of a material having a different etching selecting ratio from the source ohmic contact layer 273 and the drain ohmic contact layer 275, which will be described later.

Figure 15:
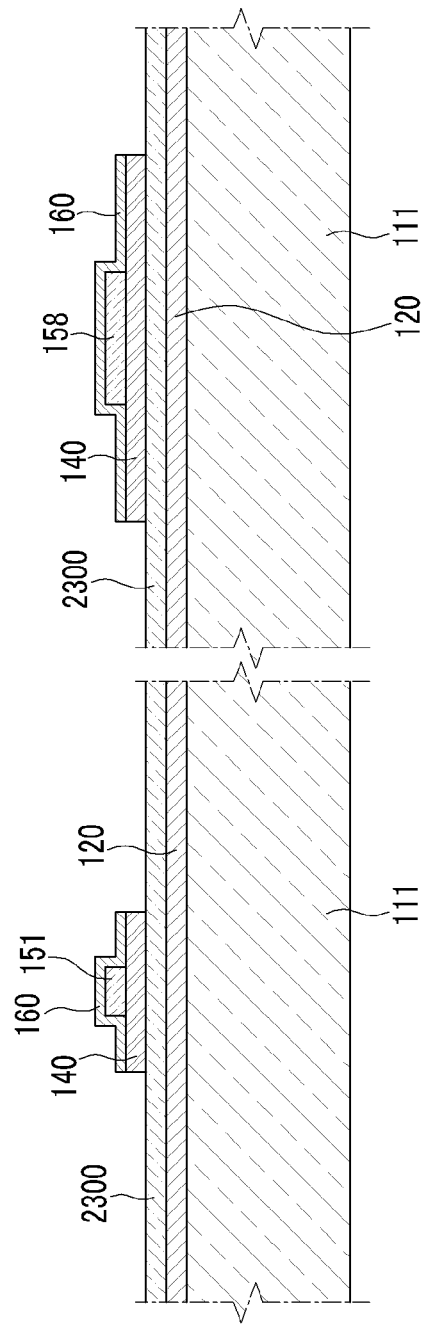

As shown in FIG. 15, an etching preventing layer pattern 160 and a gate insulating layer pattern 140 are formed by patterning the etching preventing layer 1600 and the gate insulating layer 1400, respectively. The gate insulating layer pattern 140 and the etching preventing layer pattern 160 are formed on predetermined regions of the polysilicon layer 2300. The etching preventing layer pattern 160 is formed with the same pattern as the gate insulating layer pattern 140. The gate electrode 151 and the second capacitor electrode 158 are disposed between the etching preventing layer pattern 160 and the gate insulating layer pattern 140. The etching preventing layer pattern 160 and the gate insulating layer pattern 140 are patterned by the photolithography process.

Figure 16:
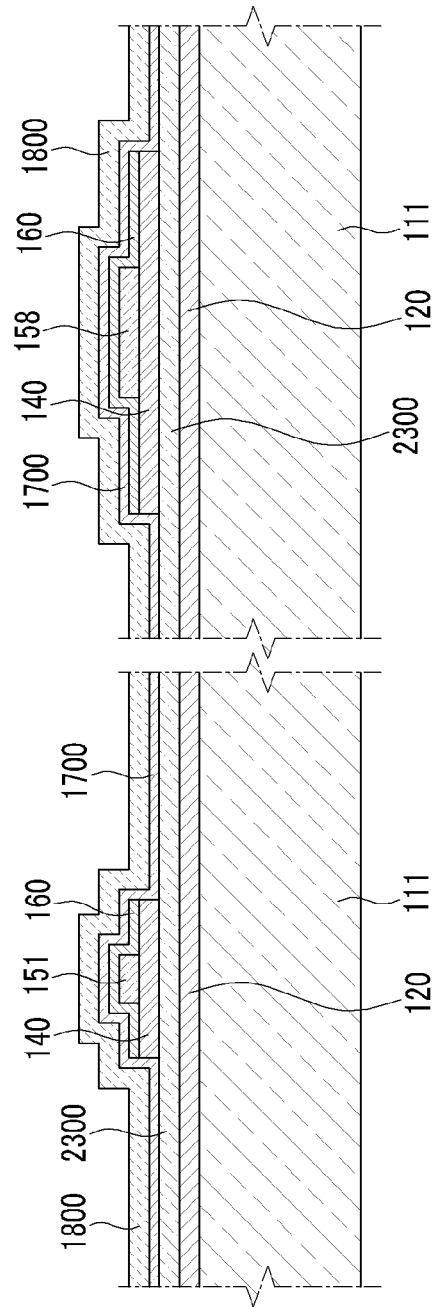

As shown in FIG. 16, an n-type or p-type impurity doped a-Si:H layer 1700 and a data metal layer 1800 are sequentially formed on the etching preventing layer pattern 160 and on the polysilicon layer 2300.

The n-type or p-type impurity doped a-Si:H layer 1700 is patterned to form the source ohmic contact layer 273 and the drain ohmic contact layer 275, as shown in FIG. 11. The data metal layer 1800 is patterned to form the source electrode 283 and the drain electrode 285, as shown in FIG. 11. The polysilicon layer 2300 is patterned to form the active layer 231 and the first capacitor electrode 238, as shown in FIG. 11. The source ohmic contact layer 273, the drain ohmic contact layer 275, the source electrode 283, the drain electrode 285, the active layer 231, and the first capacitor electrode 238 are patterned by the photolithography process.

The source ohmic contact layer 273 and the drain ohmic contact layer 275 are formed on an area of the active layer 231 that does not overlap the etching preventing layer pattern 160 and over the etching preventing layer pattern 160. The source ohmic contact layer 273 and the drain ohmic contact layer 275 are separated with the gate electrode 151 disposed therebetween.

The source electrode 283 and the drain electrode 285 are formed with the same pattern with the source ohmic contact layer 273 and the drain ohmic contact layer 275, respectively. Therefore, the source electrode 283 and the drain electrode 285 are separated from each other in a manner similar to that of the source ohmic contact layer 273 and the drain ohmic contact layer 275. The source ohmic contact layer 273, the drain ohmic contact layer 275, the source electrode 283, and the drain electrode 285 are horizontally separated from the gate electrode 151.

Through the above-described manufacturing method, the display device 102, according to the present exemplary embodiment, can be manufactured. That is, the enlarged display device 102 can be efficiently manufactured and the whole manufacturing process can be simplified.

The active layer 231, the first capacitor electrode 238, the source ohmic contact layer 273, the drain ohmic contact layer 275, the dummy ohmic contact layer 278, the source electrode 283, the drain electrode 285, and the dummy electrode 288 can be formed together by one photolithography process. Hence, at least one photolithography process is reduced according to the present exemplary embodiment, as shown in FIG. 11, when compared to the previous exemplary embodiment, as shown in FIG. 3.

Figure 17:
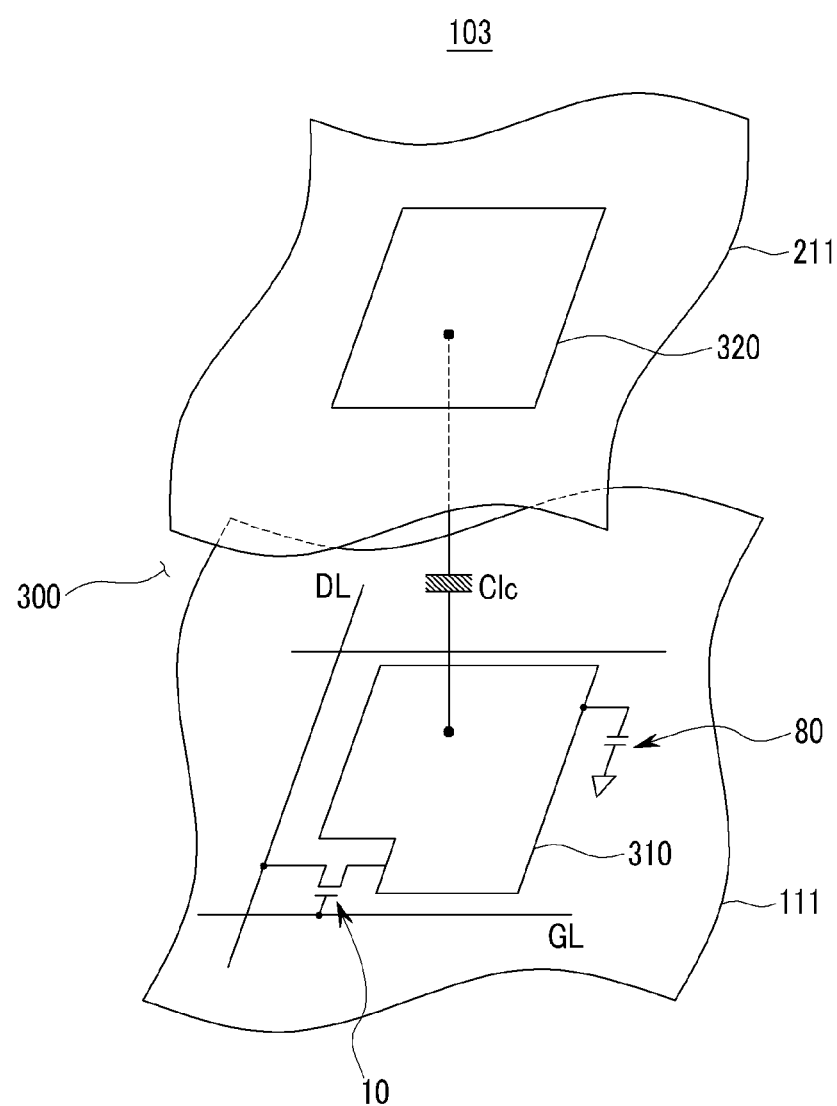
FIG. 17 shows an equivalent circuit showing a pixel circuit of a display device according to another exemplary embodiment.

Further, the display device 102 is manufactured without using the ion shower or ion implanter process while having the polysilicon TFT. Also, the display device 102 is stably manufactured by preventing overetching. A display device, according to another exemplary embodiment, will now be described with reference to FIG. 17.

The display device 102 includes a liquid crystal layer 300 rather than the organic light emitting diode 70 (shown in FIG. 2), and the thin-film transistor 10 and the capacitor 20 (shown in FIG. 2) have a same configuration as the exemplary embodiment shown in FIG. 3. That is, the display device 102 is a liquid crystal display (LCD) of the exemplary embodiment shown in FIG. 11. The liquid crystal layer 300 can include various types of liquid crystal as is understood by one of ordinary skill in the art. Also, the display device 102 further includes a counter substrate 211 facing a substrate 111 and the liquid crystal layer 300 is disposed therebetween.

A pixel electrode 310 connected to a drain electrode of the TFT 10 is formed on the substrate 111, and a common electrode 320 facing the pixel electrode 310 is formed on the counter substrate 211. The liquid crystal layer 300 is disposed between the pixel electrode 310 and the common electrode 320. The display device 102 can further include polarizing plates (not shown) respectively attached to the main substrate body 111 and the counter substrate 211.

A method of manufacturing the TFT 10 and the capacitor 80 of the display device 102 according to the present exemplary embodiment corresponds to the previous exemplary embodiments. In the present exemplary embodiment, the liquid crystal layer 300 and the counter substrate 211 are not restricted to the configuration shown in FIG. 17. The liquid crystal layer 300 and the counter substrate 211 can have various configurations as would be understood by one of ordinary skill in the art.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
an active layer disposed on a substrate;
a gate insulating layer pattern disposed on a region of the active layer;
a gate electrode disposed on a region of the gate insulating layer pattern;
an etching preventing layer pattern covering the gate insulating layer pattern and the gate electrode; and
a source member and a drain member disposed on the active layer and the etching preventing layer pattern,
wherein the source member comprises a source electrode and the drain member comprises a drain electrode, and
wherein the etching preventing layer pattern is configured to prevent the active layer from being patterned when the source electrode and the drain electrode are patterned.

2. The thin film transistor of claim 1, wherein the gate insulating layer pattern and the etching preventing layer pattern are patterned according to the same pattern.

3. The thin film transistor of claim 1, wherein the source member and the drain member are disposed on the active layer and are separated by a space.

4. The thin film transistor of claim 3, wherein the active layer is disposed, in part, according to the same pattern as the source member and the drain member, and
wherein the source member is separated from the drain member.

5. The thin film transistor of claim 1, wherein the etching preventing layer pattern has an etching selecting ratio different from an etching selecting ratio of the source member and the drain member.

6. The thin film transistor of claim 4, wherein the source member further comprises:
a source ohmic contact layer disposed between the source electrode and the active layer, and
wherein the drain member further comprises:
a drain ohmic contact layer disposed between the drain electrode and the active layer.

7. The thin film transistor of claim 6, wherein the source ohmic contact layer is disposed below the source electrode and above a portion of the etching preventing layer directly in contact with the gate insulating layer, and
wherein the drain ohmic contact layer is disposed below the drain electrode and above another portion of the etching preventing layer directly in contact with the gate insulating layer.

8. The thin film transistor of claim 6, wherein the source ohmic contact layer and the drain ohmic contact layer comprise an n-type or p-type impurity doped hydrogenated amorphous silicon (a-Si:H) layer.

9. A display device, comprising:
a display comprising a display area; and
a thin film transistor (TFT) disposed in the display area, the TFT comprising:
an active layer disposed on a substrate;
a gate insulating layer pattern disposed on a region of the active layer;
a gate electrode disposed on a region of the gate insulating layer pattern;
an etching preventing layer pattern covering the gate insulating layer pattern and the gate electrode; and
a source member and a drain member disposed on the active layer and the etching preventing layer pattern,
wherein the source member comprises a source electrode and the drain member comprises a drain electrode, and
wherein the etching preventing layer pattern is configured to prevent the active layer from being patterned when the source electrode and the drain electrode are patterned.

10. The display device of claim 9, wherein the gate insulating layer pattern and the etching preventing layer pattern are patterned according to the same pattern.

11. The display device of claim 9, wherein the source member and the drain member are disposed on the active layer and are separated by a space.

12. The display device of claim 11, wherein the active layer is disposed, in part, according to the same pattern as the source member and the drain member, and
wherein the source member is separated from the drain member.

13. The display device of claim 9, wherein the etching preventing layer pattern has an etching selecting ratio different from an etching selection ratio of the source member and the drain member.

14. The display device of claim 13, wherein:
the source member further comprises:
a source ohmic contact layer disposed between the source electrode and the active layer, and
wherein the drain member further comprises:
a drain ohmic contact layer disposed between the drain electrode and the active layer.

15. The display device of claim 14, wherein the source ohmic contact layer is disposed below the source electrode and above a portion of the etching preventing layer directly in contact with the gate insulating layer, and
wherein the drain ohmic contact layer is disposed below the drain electrode and above another portion of the etching preventing layer directly in contact with the gate insulating layer.

16. The display device of claim 14, wherein the source ohmic contact layer and the drain ohmic contact layer comprise an n-type or p-type impurity doped hydrogenated amorphous silicon (a-Si:H) layer.

17. The display device of claim 9, further comprising a capacitor comprising:
a first capacitor electrode disposed on a same layer as the active layer;
a gate insulating layer pattern disposed on the first capacitor electrode; and
a second capacitor electrode comprising the same material as the gate electrode on the gate insulating layer pattern.

18. The display device of claim 17, wherein the capacitor further comprises:
a dummy ohmic contact layer disposed on the second capacitor electrode; and
a dummy electrode disposed on the dummy ohmic contact layer,
wherein the etching preventing layer pattern is disposed between the dummy ohmic contact layer and the second capacitor electrode.

19. The display device of claim 18, wherein the first capacitor electrode, the gate insulating layer pattern, the etching preventing layer pattern, the dummy ohmic contact layer, and the dummy electrode are disposed according to the same pattern.

20. The display device of claim 17, further comprising an organic light emitting element disposed on the substrate.

21. The display device of claim 17, further comprising a liquid crystal layer disposed on the substrate.

* * * * *

UNITED STATES PATENT AND TRADEMARK OFFICE
CERTIFICATE OF CORRECTION

| | | |
|---|---|---|
| PATENT NO. | : 8,653,528 B2 | Page 1 of 1 |
| APPLICATION NO. | : 13/036241 | |
| DATED | : February 18, 2014 | |
| INVENTOR(S) | : Yong-Duck Son et al. | |

It is certified that error appears in the above-identified patent and that said Letters Patent is hereby corrected as shown below:

On the Title Page

In item (75), the Second and Seventh inventors' names contain typographical errors.

In line 2 of item (75), the second inventor's name "Ki-Young Lee" should be changed to --Ki-Yong Lee--.

In line 6 of item (75), the seventh inventor's name "Kii-Won Lee" should be changed to --Kil-Won Lee--.

Signed and Sealed this
Twenty-ninth Day of April, 2014

Michelle K. Lee
*Deputy Director of the United States Patent and Trademark Office*